United States Patent [19]
von Sichart et al.

[11] 4,336,527
[45] Jun. 22, 1982

[54] DIGITAL-TO-ANALOG CONVERTER

[75] Inventors: Frithjof von Sichart, Munich; Wolf Springstubbe, Gauting, both of Fed. Rep. of Germany

[73] Assignee: Siemens Aktiengesellschaft, Berlin & Munich, Fed. Rep. of Germany

[21] Appl. No.: 190,238

[22] Filed: Sep. 24, 1980

[30] Foreign Application Priority Data

Sep. 28, 1979 [DE] Fed. Rep. of Germany ....... 2939455

[51] Int. Cl.$^3$ .......................................... H03K 13/02
[52] U.S. Cl. ............................................. 340/347 DA
[58] Field of Search .... 340/347 DA, 347 M, 347 AD

[56] References Cited

U.S. PATENT DOCUMENTS

| | | | |
|---|---|---|---|
| 2,954,551 | 9/1960 | Doucette | 340/347 DA |
| 3,646,587 | 2/1972 | Shaffstall | 340/347 DA |
| 3,755,807 | 8/1973 | Brown | 340/347 DA |
| 4,045,793 | 8/1977 | Moench | 340/347 DA |

FOREIGN PATENT DOCUMENTS

| | | |
|---|---|---|
| 2423130 | 11/1975 | Fed. Rep. of Germany . |
| 2315986 | 3/1978 | Fed. Rep. of Germany . |
| 2043946 | 2/1971 | France . |

OTHER PUBLICATIONS

Pfrenger, "Digest of Technical Papers of 1978 IEEE International Solid-State Circuits Conference", pp. 186-187, 1978.

Primary Examiner—Charles D. Miller
Attorney, Agent, or Firm—Spellman, Joel & Pelton

[57] ABSTRACT

An R-2R-ladder network has n chained ladder cells, each controlled by an associated one of n control circuits wherein n corresponds to the number of digits of a digital signal to be converted. Each cell is composed of a series transistor inserted between two neighboring nodes of the ladder network and of a first, a second and a third cross transistor. The cross transistors are commonly connected by one main electrode to form a star circuit. The first, second and third cross transistors are connected by a second main electrode to the node of the cell, to a sum current output line and to ground, respectively. The gates of the series transistor and of the first cross transistor are directly connected to a reference voltage source whereas the gates of the second and the third cross transistor of each ladder cell are connected to a respective one of two signal outputs of the associated control circuit. Each control circuit has a signal input for receiving a digit of the digital input signal dependent upon which state the control circuit is operated to shunt the reference voltage alternatively to one of both signal outputs.

2 Claims, 1 Drawing Figure

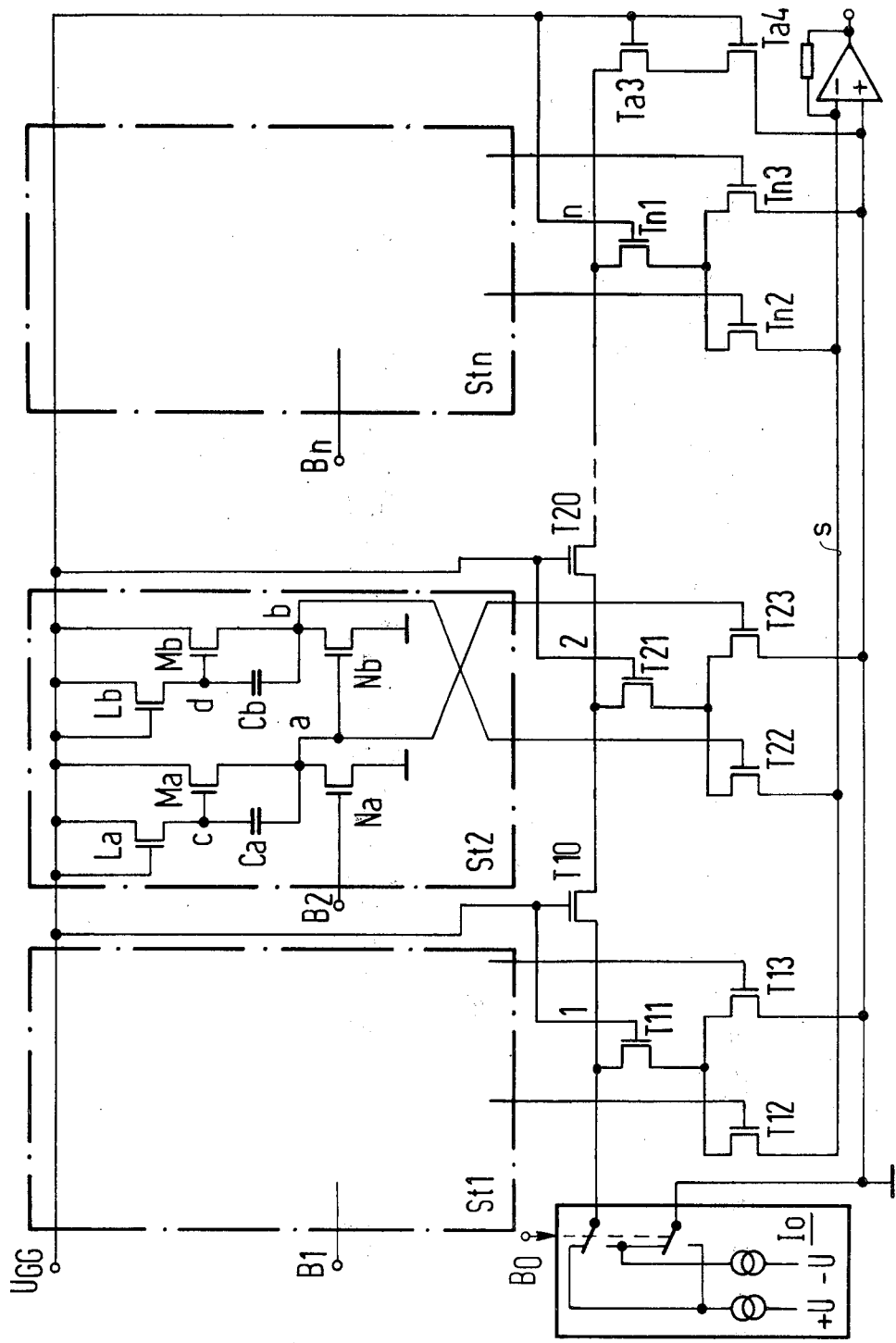

DIGITAL-TO-ANALOG CONVERTER

BACKGROUND OF THE INVENTION

The invention is related to a digital-to-analog converter having an R-2R-ladder network which is controlled by a plurality of control circuits each associated with one digit of a digital input signal.

For use with digital-to-analog converters R-2R-ladder networks are known which are designed such that all series resistors and terminator resistors at both ends are of the same resistance value R whereas the remaining cross resistors have a doubled resistance value 2R. One end of such an R-2R-ladder network forms an output for delivering an analog signal corresponding to the digital input signal. The digital input signal is composed of a plurality of digits which may be grouped by $n+m+1$ bit. This signal is converted into an analog signal according to a non-linear segmented characteristic composed of $2^{m+1}$ linear segments each having $2^n$ amplitude steps. This characteristic is achieved by design of R-2R-ladder network such that in a group of n nodes each connecting a series resistor and an associated cross resistor each node is selectively supplied with a constant current from a respective one of n constant current sources dependent upon the state of a respective one of the n least significant digits of the digital input signal. A node viewed towards the analog signal output has a distance from this ladder network end according to 1 through $2^{m-1}$ nodes determined by the order m of the associated digit. Viewed in the direction of the mentioned end of the R-2R-ladder network the node connecting a cross resistor and a series resistor is supplied with a constant current of a separate constant current source in case that at least one of the m digits of the digital input signal is comprising a binary "1".

There is also known a somewhat different design of such an R-2R-ladder network which has been published in "1978 IEEE International Solid-State Circuits Conference, Digest of Technical Papers", pages 186–187, FIG. 2 above. This R-2R-ladder network also is composed of series resistors having a resistance value R and of cross resistors having a resistance value 2R. One end of the network comprises the analog signal output. The opposite end is terminated by an additional resistor having the resistance value 2R. The number of nodes of this ladder network corresponds to the number of digits of the digital signal to be converted. Binary voltages are to be fed to the connectors of the cross resistors which are opposite to the series resistors whereby the binary voltages correspond to the digits of the digital signal.

The resistors of the R-2R-ladder network can be implemented by correspondingly controlled MOS transistors. MOS transistors forming the series resistors of resistance value R are controlled to be constantly conductive. Cross resistors are composed of source-drain-paths of two MOS transistors or two MOS transistor pairs. Each single MOS transistor when used as a cross resistor has the resistance value 2R in its conductive state. If a cross resistor is composed of a pair of MOS transistors arranged in series, each transistor has the resistance value R when conductive. Each of the MOS transistors forming the cross resistors of one ladder cell are commonly connected by one main electrode to the source of the associated MOS transistors designed as series resistor of the cell. Corresponding first transistors of the transistor pairs each coupled to a respective series transistor are commonly connected to ground by their second main electrodes whereas the second MOS transistors correspondingly are commonly connected to a control potential. Associated with each of the MOS transistors forming a cross-resistor is a respective one of control circuits having two alternatively activated outputs each connected to a gate of a first or second MOS transistor respectively.

The accuracy of converting a digital input signal into an analog output signal apart from geometrical tolerances of the MOS transistors comprising the R-2R-ladder network depends upon the influence of the gate-source voltage and the gate-drain-voltage on the effective resistance of a conductive MOS transistor. Therefore, resistance values of the individual MOS transistors deviate from a theoretically uniform resistance value R in both directions relatively more or less. The actual amount of relative deviation is subject to the present bit combination of the digital input signal. The resulting converted analog signal may present a relative failure of up to 20%.

In "1978 IEEE International Solid-State Circuit Conference, Digest of Technical Papers", pages 186 and 187, FIG. 2 below, furthermore, there is shown another design of an R-2R-ladder network also composed of series resistors of resistance values R and cross resistance values 2R. To a constant current is supplied to the node connecting a cross resistor and a neighboring series resistor and forming one end of the R-2R ladder network. The opposite end of the R-2R-ladder network is terminated by an additional resistor of resistance value 2R. Again, the number of cross resistors of the ladder network corresponds to the number of digits of the digital signal. The connectors of the cross resistors opposite to the node connection are, dependent upon the present bit combination of the digital signal, directly connectable either to the low end pole of the constant current source or to a sum current line. The sum current line supplies identical potentials to all connectors and represents the analog signal output.

Also in this case the resistors of the R-2R-ladder network may be implemented by MOS transistors, wherein all resistors of resistance value 2R may be composed of a pair of two identical MOS transistors connected in series and having a resistance value R when conductive. Cross resistors are implemented by a first and a second pair of MOS transistors. All first transistor pairs are inserted between a respective node connecting a series resistor to a cross resistor and the grounded low end of the constant current source. The second transistor pairs are arranged between such a respective node and the sum current line.

By an R-2R-ladder network of this design theoretically an accurate digital-to-analog conversion is achieved. This is true if the resistance values R of the individual MOS transistors in actual implementation can be obtained such that just negligible deviation from the uniform value can occur. In practice, the accuracy of the operation of the network again depends upon geometrical tolerances of the MOS transistors and the influence of gate-source-voltages and gate-drain-voltages on the effective resistances of MOS transistors when conductive.

It is, therefore, an object of the present invention to provide an improved digital-to-analog converter composed of an R-2R-ladder network wherein the resistors of the network are implemented by MOS transistors.

Another object of the present invention is to provide such a digital-to-analog converter of a design which allows to match the theoretically uniform resistance value of the R-2R-ladder network in fact more precisely than with conventional cells of R-2R-ladder networks.

Still another object of the present invention is to compose the R-2R-ladder network of less MOS transistors for obtaining an advanced design in an integrated semiconductor technology.

SUMMARY OF THE INVENTION

There is disclosed an improved digital-to-analog converter for converting a digital input signal with a plurality of binary digits into a corresponding analog output signal. There is provided an R-2R-ladder network with a plurality of chained ladder cells corresponding in number to the number of digits. Each ladder cell is composed of a series transistor inserted between two neighboring nodes of the network and of cross transistors which are arranged between the node in front of the series transistor and a sum current line and a common ground connection, respectively. A constant current source is arranged at the front end of the ladder network. A reference voltage source is directly connected in common to the gates of the series transistors. Associated with each ladder cell there is arranged a respective control circuit having a signal input for receiving a digit of the digital input signal and having two signal outputs for supplying alternate control signals to the gates of the cross transistors.

The improvement according to the present invention is obtained by cells of the R-2R-ladder network which are each composed of a series transistor and of first, second and third cross transistors. The cross transistors are commonly connected by one of their main electrodes to form a star circuit. Each of the first, second and third cross transistors is connected by a second main electrode to the node in front of the series transistor, to the sum current output line and to the common ground connection, respectively. The gate of the first cross transistor is directly connected to the reference voltage source and each of the gates of the second and the third cross transistor is connected to a respective one of the alternatively operative signal outputs of the associated control circuit.

This design of a digital-to-analog converter which is especially applicable for converting pulse coded time multiplex signals has the advantage that despite of small deviations of gate-source-voltages or gate-drain-voltages of the MOS transistors and resulting from that despite of residual inaccuracies in implementing the uniform resistance values R and 2R of the ladder network the effective parameters and the performance of the network are not affected. In consequence, the accuracy of this converter is reasonably improved even if the design of the converter of the present invention is at least to some extent simpler as with comparable conventional converters.

BRIEF DESCRIPTION OF THE DRAWING

A better understanding of the invention may be had by reference to the following description of a preferred embodiment in conjunction with the accompanying drawing showing a circuit diagram of a digital-to-analog converter designed according to the present invention

DETAILED DESCRIPTION OF THE PREFERRED EMBODIMENT

For converting digital signals consisting of a plurality of bits B0 through Bn which digital signals may comprise pulse coded time multiplex (PCM) signals, the circuit arrangement shown in the single drawing is provided with a plurality of identical control circuits St1 through Stn and with an R-2R-ladder network comprising n cells which are composed of identical MOS transistors and which may be integrated into one chip.

Part of this R-2R-ladder network are n MOS transistors T10, T20 etc. which source-drain-paths are providing series resistors of the R-2R-ladder network. These MOS transistors are commonly controlled to be constantly conductive by a control voltage $U_{GG}$ of $+12$ V which voltage is supplied in parallel to the gates of each of these transistors. The cross resistors of the R-2R-ladder network are composed of a multiplicity of further MOS transistors T11 through T12, T21 through T23, etc. which are star-connected by one of the main electrodes. First transistors T11, T21 through Tn1 of the star circuit transistors each are connected by a second main electrode which is opposite to the star-connection to a respective node of the ladder network, i.e. the connecting point of a series resistor and the respective cross resistor. The second MOS transistors T12, T22 through Tn2 of the star circuits are arranged between the star-connection and a sum current line s which will be described later in more detail. The third transistors T13, T23 through Tn3 of the star circuits are commonly grounded by their second main electrodes opposite to the star-connection.

A constant current source Io is associated with the R-2R-ladder network and supplies a constant current of 200 μA to the network with positive or negative signs depending upon the status of the sign digit B0 of a digital signal to be converted. This constant current source for generating a bipolar constant current may be of any conventional design, therefore, it is just schematically represented in the drawing and a detailed description is deemed not to be necessary.

While one end of the R-2R-ladder network is connected to the constant current source Io, the far end is terminated by two further MOS transistors Ta3 and Ta4 which are connected in series by their drain-source paths and which are constantly conductive under control of the control voltage $U_{GG}$ supplied to their respective gates.

The sum current line s connected in parallel to all second transistors T12, T22 through Tn2 is applied to the negative input of an operational amplifier which is designed as inverting amplifier by a corresponding feedback network. The positive input of the operational amplifier is connected to the common ground connection which is attached to the low end point of the constant current source Io and to each of the third transistors T13, T23 through Tn3 of the star circuits, as well. The output of the operational amplifier forms the analog output of the digital-to-analog converter.

The first transistors T11, T21 through Tn1 of the n star circuits are controlled to be constantly operative, since the control voltage $U_{GG}$ is not only applied in parallel to the gates of the MOS transistors arranged in series but to the gates of the first transistors of the star circuits. Each of the gates of the second and third transistors of the star circuit are connected to the respective one of two outputs of an associated control circuit.

These control circuits St1 through Stn each associated with one of the star circuits of the R-2R-ladder network are of identical design, as is shown in detail for the second control circuit St2. A control circuit Sti—where i represents any number 1 through n—mainly is composed of two chained inverters which are also implemented by MOS transistors Na and Nb. One main electrode of both transistors is connected to ground and the other main electrode is connected to the control voltage $U_{GG}$ via a respective boot-strap circuit composed of a pair of further MOS transistors La, Ma and Lb, Mb, respectively, and of a charge capacitor Ca and Cb, respectively. The MOS transistors of the control circuit Sti may be identically implemented and may also represent $n^+$-MOS transistors of a carrier concentration type.

The gate connector of the first inverter of a control circuit Sti forms a control input supplied by the associated digit signal Bi of the digital signal. The status "1" of each bit of the digital signal may be represented by +10 V whereas the status "0" may be represented by 0 V which potentials are applied to the gate of the first inverter Na. Assuming now the status "1" of the corresponding bit, the first inverter Na is turned into its operative condition by the applied potential. This results in a potential of about 0 V at the electrode opposite to the ground connection, i.e. at a connector tap designated by reference symbol a. At the same time, transistor Ma which is connected by one electrode to this connector tap a is also operative. This also applies to the second transistor La of the associated boot-strap circuit until a potential of about +10 V is built up at a connector tap c connecting the electrode of the second transistor La of the boot-strap circuit opposite to the control voltage $U_{GG}$, on the one hand, and the gate of the first transistor Ma of the boot-strap circuit, on the other hand.

By this operation the second inverter Nb of the control circuit, since its gate is also connected to connector tap a, is switched off, thereby causing a potential of about +12 V at a further connector tap b which connected the electrode of the second inverter Nb opposite to the ground connection to one electrode of the first transistor Mb of the second corresponding boot-strap circuit. The inoperative condition of the second inverter Nb causes a voltage at a further connector tap d which corresponds to connector tap c of the first boot-strap circuit of about +20 V.

Each of the connector taps a and b of both boot-strap circuits forms one of the alternatively operative outputs of the control circuit and is connected to a respective gate of the second and the third transistors Ti2 and Ti3, of the associated star circuit. In the operating condition, described above, the third MOS transistor Ti3 of the star circuit is turned off whereas the second transistor Ti2 of the associated star circuit is conductive.

In the opposite case when a bit Bi supplied to control circuit Sti is in the state "0" the first inverter Na is switched off and the potential at connector tap c of the associated boot-strap circuit is shifted to +20 V whereas the potential at connector tap a is about +12 V. This means that the second inverter Nb is driven into an operative condition causing a potential at connector tap b of about 0 V and a potential at connector tap d of about +10 V. Accordingly, control circuit Sti controls switching of the third transistor Ti3 of the associated star circuit into an operative condition whereas the second transistor Ti2 is turned off. Correspondingly, the same characteristics apply to all control circuits each controlling an associated one of the star circuits of the R-2R-ladder network.

The described implementation of the control circuit Sti having two chained MOS transistor inverters Na and Nb connected to a control voltage $U_{GG}$ via a respective boot-strap circuit has the advantage that the control voltage $U_{GG}$ is applied in total to the gate electrode of the transistors of the respective star circuit. However, the control circuit Sti also could be designed such that the inverters are connected to the control voltage $U_{GG}$ via an $n^+$-MOS transistor of the carrier concentration type which is used as load resistor. Since such an implementation in principle is known in the art, it is deemed not to be necessary to represent and describe this variation of the design in detail. Furthermore, instead of chained inverters the control circuits also could employ bistable flip-flops controlling corresponding load elements which are operated such that the control voltage $U_{GG}$ is applied in total and exclusively to one of the two transistors Ti2 and Ti3 of the associated star circuit.

The implementation of the control circuits described is such that the gate of the operative one of the MOS transistors Ti2 or Ti3 of the associated star circuit, the gates of the constantly operative transistors T10, T20 etc. forming the series resistors of the R-2R-ladder network and the gates of the first transistors Ti1 of the star circuits, also constantly conductive, are supplied by the same potential of the control voltage $U_{GG}$. The inoperative transistors of the star circuits Ti3 and Ti2, respectively, receive a control voltage at its gate electrode which is definitely beneath the threshold potential of an MOS transistor. Thus, depending upon the state of digit Bi supplied to the associated control circuit Sti one of both MOS transistors Ti2 and Ti3, respectively, of the associated star circuit is conductive, whereas the corresponding MOS transistor is controlled to be non-conductive. Assuming the implementation of the control circuit Sti as described above the digit Bi of status "0" is evaluated to drive the third MOS transistor Ti3 of the star circuit to be conductive, whereas in case of state "1" of the digit Bi the second MOS transistor Ti2 of the star circuit is conductive.

Influenced by different gate-source voltages and gate-drain voltages the resulting resistance values of the individual MOS transistors could deviate from a uniform resistance value R more or less, when, in case of a positive (negative) sign of the constant current which is supplied to the R-2R-ladder network by the constant current source Io, the resistance of the first MOS transistor Ti1 is larger (smaller) than the resistance of either the second or third transistor Ti2 and Ti3 dependent upon which one is presently conductive.

In the present invention such conventional design restrictions are overcome to a great extent by the combined influence of the design parameters. The gates of the constantly conductive MOS transistors, like transistor Ti0 forming a series resistor of the R-2R-ladder network and transistor Ti1 comprising the first transistor of the associated star circuit and the gate of the presently conductive second or third transistor Ti2 and Ti3, respectively, as well are supplied with the total potential of the same control voltage $U_{GG}$. This also applies to transistors Ta3 and Ta4 being terminator resistors of the R-2R-ladder network.

Furthermore, the drain electrodes of the second transistors Ti2 of the star network which are connected to the sum current line s thereby are held on a "virtual ground" potential and the drain of the third transistors Ti3 of the star network connected to the grounded low end of the constant current source Io, as well, are identically fixed to ground potential.

Thereby, it is achieved that the resistance values of each of the series transistors Ti0 of the R-2R-ladder network equal exactly the resistance value of the directly connected respective first transistor Ti1 of the associated star network. On the other hand the resistance values of MOS transistors Ti2 or Ti3 under control of the control circuit Sti equal, apart from negligible deviations, the resistance values of the remaining part of the R-2R-ladder network opposite to the constant current source Io. A digital signal composed of digits B0, B1, ... Bn therefore is converted into an accumulated sum current:

$$I = \sum_{i=1}^{n} Bi \times \frac{Io}{2^i}$$

which appears to be accurately the converted analog signal corresponding to the digital input signal.

There has thus been shown and described a novel digital-to-analog converter designed to be implemented in an integrated semiconductor technology and composed of only one type of MOS transistors which fulfills all the objects and advantages sought therefore. Many changes, modifications, variations and other uses and applications of the subject invention, will however become apparent to those skilled in the art after considering the specification and the accompanying drawing which disclose a preferred embodiment thereof. Besides modifications already mentioned hereinbefore, it should be pointed out by the way of a further example that instead of $n^{30}$-MOS transistors also $p^+$-MOS transistors of the carrier concentration type could be implemented, in which case a control voltage $U_{GG}$ of $-12$ V would apply accordingly. All such changes, modifications, variations and other uses and applications which do not depart from the spirit and scope of the invention are deemed to be covered by the invention which is limited only by the claims which follow.

What is claimed is:

1. In a digital-to-analog converter for converting a digital input signal representing a plurality of binary digits into a corresponding analog output signal, said converter having (1) an R-2R-ladder network with a plurality of chained ladder cells corresponding in number to the number of said digits wherein each of the resistances of the R-2R-ladder network is formed of a respective drain-source path of mutually identical MOS transistors integrated on a common chip and wherein each ladder cell is composed of a series transistor inserted between two neighboring nodes of the ladder network and of cross transistors arranged between the node in front of said series transistor and a sum current output line and a common ground connection, respectively; (2) a constant current source arranged at one end of said ladder network; (3) a reference voltage source directly connected in common to the gates of said series transistors; and (4) a plurality of control circuits each receiving a respective digit of said digital input signal at a signal input, each of said control circuits associated with one cell of said ladder network and having two signal outputs for supplying alternate control signals to the gates of said cross transistors, the improvement comprising:

said cells of the R-2R-ladder network each being composed of a series transistor and of first, second and third cross transistors commonly connected by one of their main electrodes to a star circuit, and each of said first, second and third cross transistors connected by their second main electrodes to said node in front of the series transistor, to the sum current output line and to the common ground connection, respectively, wherein the gates of said first cross transistors are directly connected to said reference voltage source and each of the gates of said second and said third cross transistors is connected to a respective one of the alternatively operative signal outputs of the associated control circuit, and said control circuits being connected in parallel to said reference voltage source and including switch means arranged between the reference voltage source and the signal outputs for shunting said reference voltage alternatively to one of said signal outputs in dependence upon the state of the respective digit of the digital input signals.

2. The digital-to-analog converter as recited in claim 1, wherein the switch means of each control circuit comprises a first and a second inverter each composed of a MOS transistor having a gate, a source electrode and a drain electrode, each of said inverters being connected by their drain electrodes to ground and by their source electrodes to a respective one of the signal outputs, said first inverter being connected by its gate electrode to said signal input, said gate of said second inverter being connected to said source electrode of said first inverter, and identical boot-strap circuits each arranged between the source electrode of a respective one of said first and second inverters and said reference voltage source.

* * * * *